United States Patent
Hernes

(10) Patent No.: US 10,135,453 B2
(45) Date of Patent: Nov. 20, 2018

(54) SAR ADC WITH THRESHOLD TRIGGER FUNCTIONALITY FOR REDUCED POWER CONSUMPTION

(71) Applicant: Disruptive Technologies Research AS, Rådal (NO)

(72) Inventor: Bjornar Hernes, Trondheim (NO)

(73) Assignee: DISRUPTIVE TECHNOLOGIES RESEARCH AS, Radal (NO)

( * ) Notice: Subject to any disclaimer, the term of this patent is extended or adjusted under 35 U.S.C. 154(b) by 0 days.

(21) Appl. No.: 15/400,513

(22) Filed: Jan. 6, 2017

(65) Prior Publication Data

US 2017/0194978 A1 Jul. 6, 2017

Related U.S. Application Data

(60) Provisional application No. 62/275,362, filed on Jan. 6, 2016.

(51) Int. Cl.
*H03M 1/38* (2006.01)
*H03M 1/00* (2006.01)
*H03M 1/46* (2006.01)
*H03M 1/12* (2006.01)
*H03M 1/80* (2006.01)

(52) U.S. Cl.
CPC ......... *H03M 1/002* (2013.01); *H03M 1/1245* (2013.01); *H03M 1/466* (2013.01); *H03M 1/804* (2013.01)

(58) Field of Classification Search
CPC .... H03M 1/002; H03M 1/1245; H03M 1/462; H03M 1/466; H03M 1/804
USPC ........................................ 341/161, 163, 172
See application file for complete search history.

(56) References Cited

U.S. PATENT DOCUMENTS 8,633,844 B2 * 1/2014 Piasecki ................ H03M 1/468
341/155

* cited by examiner

*Primary Examiner* — Khai M Nguyen
(74) *Attorney, Agent, or Firm* — Miller, Matthias & Hull LLP

(57) ABSTRACT

An ADC method and system implement a comparison stage of SAR ADC directly in the analog domain rather than the digital domain, without resolving the output word $D_{out}$. This means that the number of comparisons, and thus the numbers of required periods of CK, equals number of threshold values instead of equaling the number of bits in the resolved output word. In this way, power is saved in the analog domain as well as in the digital domain.

14 Claims, 5 Drawing Sheets

SAR ADC WITH THRESHOLD TRIGGER FUNCTIONALITY FOR REDUCED POWER CONSUMPTION

TECHNICAL FIELD

The present disclosure relates generally to analog-to-digital converters (ADCs) and, more particularly, to systems and methods for performing Successive-approximation-register (SAR) ADC in a wireless sensor node device.

BACKGROUND

In battery-powered electronic devices, power dissipation is an important consideration; power dissipation affects both battery life and device heat levels. Further, wireless sensor devices often include analog-to-digital converters (ADCs) for digitizing sensor outputs and it becomes important to reduce the power dissipation of each ADC to reduce the overall power consumption of the device. In the last decade, the SAR (Successive-approximation-register) ADC has become popular due to its low power dissipation and scalability with finer process geometries.

Typically, sensor readout systems measure when the sensor output crosses a certain threshold level. This is generally done by digitizing the sensor output and performing a comparison in the digital domain. However, even when using SAR ADC technology, this still consumes appreciable power.

The present disclosure is directed to addressing one or more deficiencies and/or disadvantages, e.g., as set forth above or otherwise. However, it should be appreciated that the solution of any particular problem is not a limitation on the scope of this disclosure or of the attached claims except to the extent expressly noted. Moreover, this Background section reflects the inventors' thoughts and is not intended to accurately or completely reflect any particular prior art. As such, Applicants expressly disclaim this material as admitted prior art.

SUMMARY OF THE DISCLOSURE

In one aspect of the disclosed principles, a method of analog-to-digital conversion is implemented in a sensor circuit with an input of $V_{IN}$ and having an ADC with a capacitor array comprising a plurality of capacitors connected through a respective plurality of switches, a comparator, an SAR module and a multiplexer (MUX) connecting the SAR module to the DAC. The method includes executing a track phase when a sample clock signal CK_SMP is low by applying an input voltage $V_{IN}$ over all capacitors in the capacitor array of the ADC. A sampling phase is then executed on a subsequent CK_SMP by opening the respective plurality of switches such that a sample of $V_{IN}$ is stored over the capacitor array of the ADC. In a subsequent comparison phase, the MUX is set to select an n-bit threshold value $D_{THRESHOLD,0}$ which is applied to the ADC capacitor array, connecting all switches $S_i$, where i is in the range from 0 to n−1, which receive 1, to a reference voltage $V_{REF}$ and connecting the remaining switches to a common mode voltage $V_{CM}$ such that the output VP of the ADC reaches a value equal to the input voltage $V_{IN}$ subtracted from the analog of $D_{THRESHOLD,0}$, and completing the comparison to $V_{CM}$ by the comparator at the comparator clock CK, such that if VP>$V_{CM}$, then DP is 1 and the sample of $V_{IN}$ is larger than $D_{THRESHOLD,0}$, and otherwise, if VP<$V_{CM}$, then DP is 0 and the sample of $V_{IN}$ is smaller than $D_{THRESHOLD,0}$. Another threshold value $D_{THRESHOLD,j}$ is selected, where j is in the range from 1 to M, and the comparison phase is repeated until all M threshold values have been compared. After any comparison between $V_{in}$ and $D_{threshold,i}$, and as a consequence of the comparison, a full SAR conversion can be carried out to obtain a full resolution quantization of the input voltage.

In another embodiment, a sensor system is provided including a processor configured to execute a method of analog-to-digital conversion in a sensor circuit with an input of $V_{IN}$ and having an ADC with a capacitor array comprising a plurality of capacitors connected through a respective plurality of switches (collectively a DAC), a comparator, an SAR module and a multiplexer (MUX) connecting the DAC to the SAR module. The processor executes the method by executing a track phase when a sample clock signal CK_SMP is low by applying an input voltage $V_{IN}$ over all capacitors in the capacitor array of the ADC. The processor then executes a sampling phase on a subsequent rising edge of CK_SMP by opening the respective plurality of switches such that a sample of $V_{IN}$ is stored over the capacitor array of the ADC. Finally, a comparison phase is executed by setting the MUX to select an n-bit threshold value $D_{THRESHOLD,0}$ which is applied to the ADC capacitor array, connecting all switches $S_i$, where i is in the range from 0 to n−1, to a reference voltage $V_{REF}$ and connecting the remaining switches to a common mode voltage $V_{CM}$ such that the output VP of the DAC reaches a value equal to the input voltage $V_{IN}$ subtracted from the analog of $D_{THRESHOLD,0}$. The comparison to $V_{CM}$ is completed at the rising edge of the comparator clock CK, such that if VP>$V_{CM}$, then DP is 1 and the sample of $V_{IN}$ is larger than $D_{THRESHOLD,0}$, and otherwise, if VP<$V_{CM}$, then DP is 0 and the sample of $V_{IN}$ is smaller than $D_{THRESHOLD,0}$. Another threshold value $D_{THRESHOLD,j}$ is selected, where j is in the range from 1 to M, and the comparison phase is repeated until all M threshold values have been compared. After any comparison between $V_{in}$ and $D_{threshold,i}$, and as a consequence of the comparison, a full SAR conversion can be carried out to obtain a full resolution quantization of the input voltage.

In accordance with yet another embodiment, a sensor circuit is provided for executing analog-to-digital conversion of a sensed value $V_{IN}$. The sensor circuit includes an ADC having a capacitor array comprising a plurality of capacitors connected through a respective plurality of switches (collectively a DAC), a comparator, an SAR module, a MUX connecting the DAC to the SAR module, and a controller. The controller is configured to execute a track phase when a sample clock signal CK_SMP is low by applying an input voltage $V_{IN}$ over all capacitors in the capacitor array of the ADC, and to execute a sampling phase on a subsequent rising edge of CK_SMP by opening the respective plurality of switches such that a sample of $V_{IN}$ is stored over the capacitor array of the ADC. A comparison phase is executed by setting the MUX to select an n-bit threshold value $D_{THRESHOLD,0}$ which is applied to the ADC capacitor array, connecting all switches $S_i$, where i is in the range from 0 to n−1, to a reference voltage $V_{REF}$, and connecting the remaining switches to a common mode voltage $V_{CM}$. In this way, the output VP of the DAC reaches a value equal to the input voltage $V_{IN}$ subtracted from the analog of $D_{THRESHOLD,0}$, and the comparison to $V_{CM}$ is completed by the comparator at the rising edge of the comparator clock CK. If VP>$V_{CM}$, then DP is 1 and the sample of $V_{IN}$ is larger than $D_{THRESHOLD,0}$, whereas otherwise, if VP<$V_{CM}$, then DP is 0 and the sample of $V_{IN}$ is smaller than $D_{THRESHOLD,0}$. Another threshold value $D_{THRESHOLD,j}$ is selected, where j is in the range from 1 to M, and the comparison phase is repeated until all M threshold values have been compared. After any comparison between $V_{in}$ and $D_{threshold,i}$ and as a consequence of the comparison, a full SAR conversion can be carried out to obtain a full resolution quantization of the input voltage.

These and other aspects and features will be more readily understood when reading the following detailed description in conjunction with the accompanying drawings.

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Figure 1:
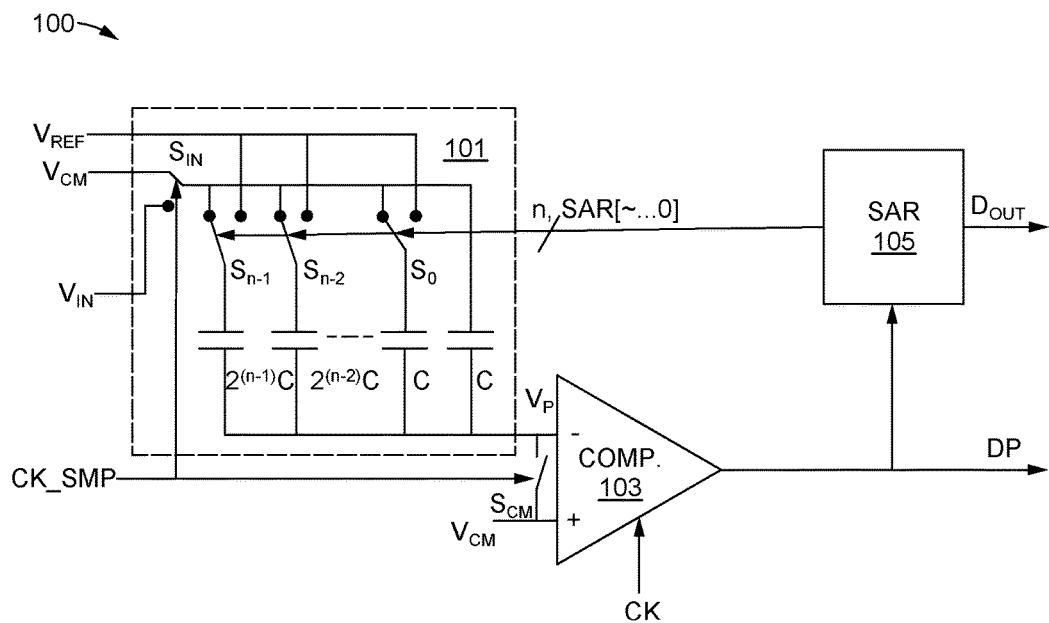
FIG. 1 is a schematic drawing of an implementation of an SAR ADC.

Before turning to a detailed discussion of the figures, a brief overview of certain disclosed features and principles will be given to aid the reader. As noted above, the ADC is often an integral part of sensor circuits, and the SAR ADC is increasingly used in this application. However, ADCs, including SAR ADCs, can consume or dissipate a significant amount of electrical power, and any energy savings in the SAR ADC will inure to the benefit of the device user in terms of lower heat and longer battery life. As such, in an embodiment of the disclosed principles, a threshold trigger functionality for reduced power consumption Referring to FIG. 1, this figure shows a simplified schematic representation of an SAR ADC. For simplicity the figure shows a single-ended system, while many implementations may be differential in order to resist noise in the circuit. While the illustrated circuit is a principal implementation of a SAR ADC, there exist a range of different implementations and the principles presented herein can be applied to any implementations that are based on charge conservation in the ADC.

The illustrated circuit 100 includes a DAC 101, a comparator 103, and an SAR 105. The circuit modes of operation include a track phase, a sampling phase and a conversion phase. In the tracking phase, CK_SMP is low, $S_{IN}$ and $S_{CM}$ are closed (conducting) and the input voltage $V_{IN}$ is applied over all capacitors in the capacitor array of the DAC. In the sampling phase, on rising edge of CK_SMP, the switches $S_{IN}$ and $S_{CM}$ open, and a sample of $V_{IN}$ is stored over the capacitor array of the DAC.

In the conversion phase, a number of steps are executed. The SAR algorithm starts by connecting the MSB switch $S_{n-1}$ to $V_{REF}$ while the rest of the switches $S_{n-2}$-$S_0$ are connected to $V_{CM}$. This is done by setting the MSB bit of the SAR[ ]-bus to 1 and the rest of the bits to 0. The comparator COMP 103 is now clocked by the rising edge of CK and the voltage VP is compared to the common mode voltage $V_{CM}$. If VP>$V_{CM}$ then DP is set to 1 and MSB in the SAR[ ]-bus is maintained 1. If VP<$V_{CM}$ then DP is set to 0 and MSB in the SAR[ ]-bus is set to 0.

The MSB-1 bit in the SAR[ ]-bus is set and the procedure above is repeated until bit 0 of the SAR[ ]-bus is evaluated and set accordingly. The result is now made available at the ADC digital output $D_{out}$.

Figure 2:
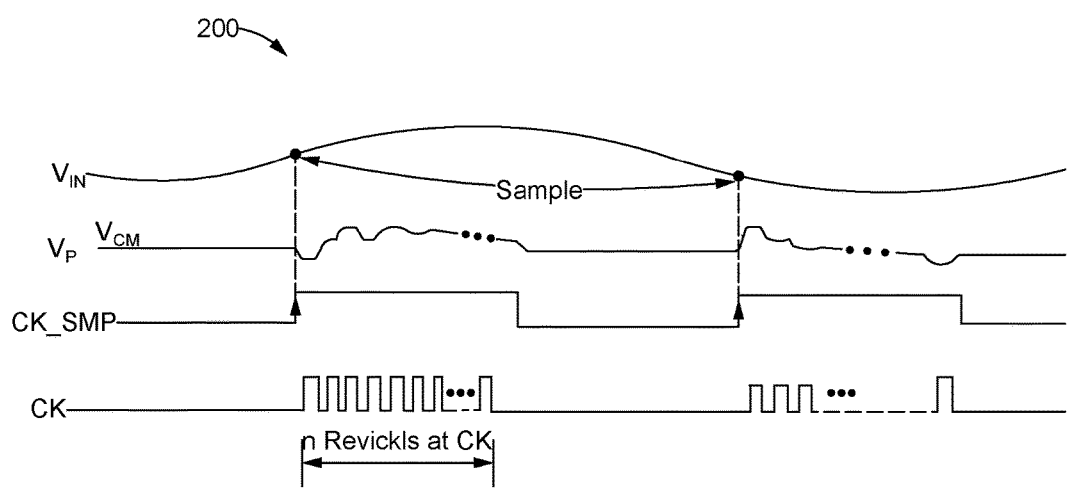
FIG. 2 is an indexed signal plot showing example signal values during operation of the SAR ADC of FIG. 1.

The indexed signal plot of FIG. 2 shows the signal values in an example during the foregoing phases.

In case of threshold comparison, the output word $D_{out}$ can now be compared to one or more threshold values in the digital domain. The power dissipation for such an ADC is strongly dependent on the number of clock cycles of CK, which is equal to number of bits in $D_{out}$. Additional power is consumed during the comparison to the threshold values in the digital domain.

In an embodiment of the disclosed principles, the comparison to the digital threshold values is executed directly in the analog domain, without resolving the output word $D_{out}$. This means that the number of comparisons, and thus the numbers of required periods of CK, equals number of threshold values instead of equaling the number of bits in the resolved output word. In this way, power is saved in the analog domain as well as in the digital domain.

Figure 3:
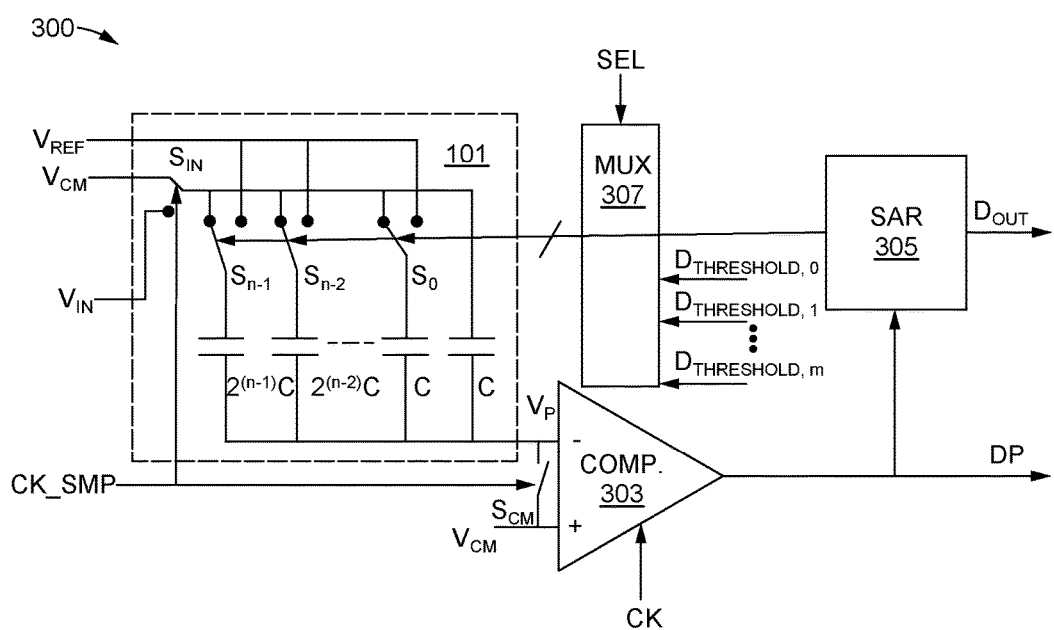
FIG. 3 is a schematic drawing of an implementation of an SAR ADC in accordance with an embodiment of the disclosed principles.

A simplified schematic of an SAR DAC in accordance with an embodiment of the disclosed principles is shown in FIG. 3. The only addition to the figure above is the MUX that can select between the ordinary output of the SAR or one of M+1 threshold values $D_{THRESHOLD,0}$ to $D_{THRESHOLD,M}$, each given as an n-bit digital word. The selection is done by the digital signal SEL. When the circuit is operated as an ordinary SAR ADC, the MUX selects the output the SAR as the input to the capacitor DAC, and goes through the number of cycles necessary to resolve the n-bit output word $D_{out}$. The procedure for resolving the n-bit output word is as explained above.

As noted above, the comparison of values to one of the digital threshold values can be executed in three phases, e.g., a track phase, a sampling phase and a comparison stage. During the track phase, CK_SMP is low, $S_{IN}$ and $S_{CM}$ are closed (conducting) and the input voltage $V_{IN}$ is applied over all capacitors in the capacitor array of the DAC. During the sampling phase, $S_{IN}$ and $S_{CM}$ open on the rising edge of CK_SMP, and a sample of $V_{IN}$ is stored over the capacitor array of the DAC.

Finally, in the comparison phase, SEL is set such that the MUX selects the n-bit threshold value $D_{THRESHOLD,0}$ which is applied to the DAC capacitor array. All switches $S_i$, where i is in the range from 0 to n−1, which receive 1 connect to VREF. The remaining switches connect to $V_{CM}$. The value of VP will reach a value equal to the input voltage $V_{IN}$ subtracted from the analog version of $D_{THRESHOLD,0}$. The comparison to VCM is now done at the rising edge of CK by the comparator COMP.

If VP>$V_{CM}$, then DP is set to 1 and the sample of $V_{IN}$ is larger than $D_{THRESHOLD,0}$. On the other hand, if VP<$V_{CM}$, then DP is set to 0 and the sample of $V_{IN}$ is smaller than $D_{THRESHOLD,0}$. The follow-up action can now be taken.

Since the charge stored at the capacitors in the DAC capacitor array is conserved, a new comparison to one of the other $D_{THRESHOLD,j}$, where j is in the range from 1 to M, can be performed by changing SEL such that new threshold value is selected for the next comparison occurring at the next rising edge of CK.

After any number of $D_{THRESHOLD,j}$ comparisons, a full SAR conversion can be carried out on the same input sample. This can be done as a result of one of the threshold conversions. For example, if the sampled $V_{IN}$ has crossed a threshold level, a full resolution digital value of the sample may be required.

Figure 4:
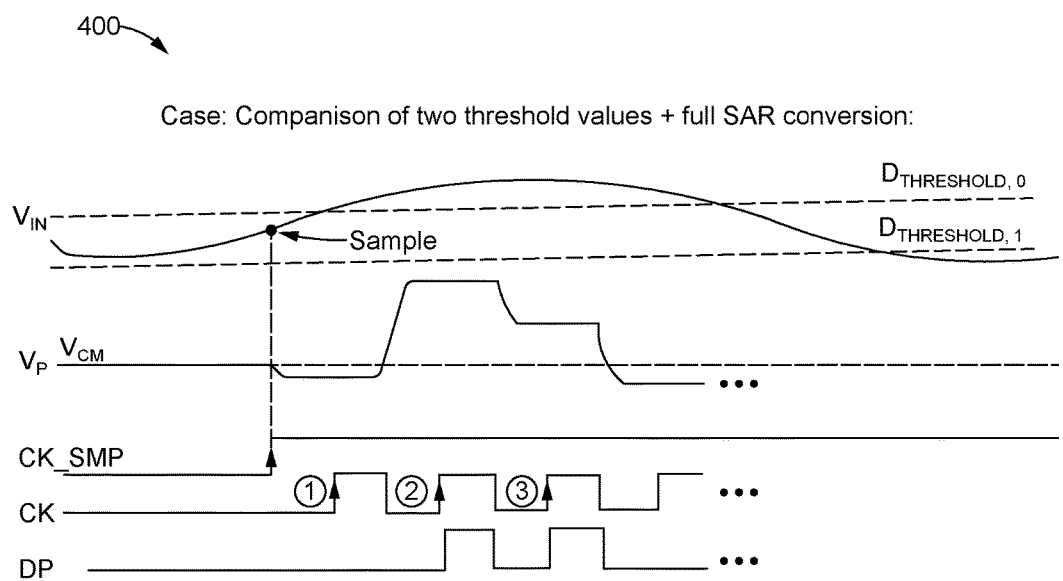
FIG. 4 is an indexed signal plot showing example signal values during operation of the SAR ADC of FIG. 3.

FIG. 4 shows the input voltage $V_{IN}$, the comparator COMP input voltage $V_P$, and the waveforms of CK_SMP, CK and DP. First $V_{IN}$ is sampled at the rising edge of CK_SMP. Then $D_{THRESHOLD,0}$ is chosen and compared at the first rising edge of CK (denoted 1). The comparison result on DP is 0 since the sampled $V_{IN}$ is less than the equivalent analog value of $D_{THRESHOLD,1}$. Further, $D_{THRESHOLD,0}$ is applied to the DAC, and the comparison is carried out at the 2nd rising edge of CK, denoted 2. DP becomes 1 since the sample of $V_{IN}$ is larger than the equivalent analog value of $D_{THRESHOLD,1}$. On the 3rd rising edge of CK (denoted 3), a full SAR conversion is started and after n additional clock cycles of CK, the n-bit word $D_{OUT}$ is ready at the ADC output.

To facilitate ultra-long battery life in sensor systems, power must be conserved. To this end, power-efficient sensor readout circuits are beneficial. The described principles conserve power by executing the threshold comparison in the analog domain and by requiring fewer conversion cycles for a full SAR conversion. Executing the threshold comparison directly in the analog domain saves both digital circuitry and electric power versus executing the comparison digitally.

In an embodiment of the disclosed principles, the input voltage $V_{IN}$ is sampled, and the sample is compared to a pre-defined digital threshold value $D_{THRESHOLD,0}$. The result DP of the comparison is used as an input to a sensor baseline tracking algorithm, tracking low speed changes due to environment parameters other than the parameter the sensor system is intended to monitor, which is assumed to be high speed.

The baseline algorithm can force a full SAR conversion, on the same sample of the input voltage $V_{IN}$, due to the value of DP obtained in this comparison and/or together with previous comparisons between $D_{THRESHOLD,0}$ to previous samples of the voltage $V_{IN}$. The digital threshold value $D_{THRESHOLD,0}$ is then updated in accordance with a baseline algorithm and previous results of comparison between previous samples of $V_{IN}$, and/or full SAR conversions.

In another embodiment of the described principles, a 2nd comparison of the same sample of $V_{IN}$ is made to a 2nd pre-defined digital threshold $D_{THRESHOLD,1}$ and the result DP of the comparison is then used as a threshold trigger for further actions. Such actions could be, for example, a full SAR conversion of the same sample of $V_{IN}$, to obtain a full resolution quantization of the sensor output, or other actions to other part of the system. In a further embodiment, the value of $D_{THRESHOLD,1}$ is used as an offset $D_{OFFSET,1}$ away from the baseline threshold $D_{THRESHOLD,0}$ and $D_{THRESHOLD,1}$ may be updated with $D_{OFFSET,1}$+$D_{THRESHOLD,0}$ when the baseline tracking algorithm updates $D_{THRESHOLD,0}$.

In another embodiment of the described principles, a 3rd comparison is performed of the same sample of $V_{IN}$ to a 3rd pre-defined digital threshold value $D_{THRESHOLD,2}$ and the result DP is applied as a threshold trigger to further actions, e.g., a full SAR conversion of the same sample of VIN to obtain a full resolution of the sensor output or other actions to other parts of the system. Similar to the above embodiment, the value of $D_{THRESHOLD,2}$ could be an offset $D_{OFFSET,2}$ ($D_{OFFSET,2} \neq D_{OFFSET,1}$) away from the baseline threshold $D_{THRESHOLD,0}$, and $D_{THRESHOLD,2}$ may be updated with $D_{OFFSET,2}$+$D_{THRESHOLD,0}$ when the baseline tracking algorithm updates $D_{THRESHOLD,0}$.

The processes described herein may be executed by controlling a circuit such as that shown in the figures, via a processor or controller executing computer-executable instructions read from a non-transitory computer-readable medium. Those of skill in the art will appreciate that many computer-readable medium exist, including optical and magnetic memory media, flash memory media, and so on.

Figure 5:
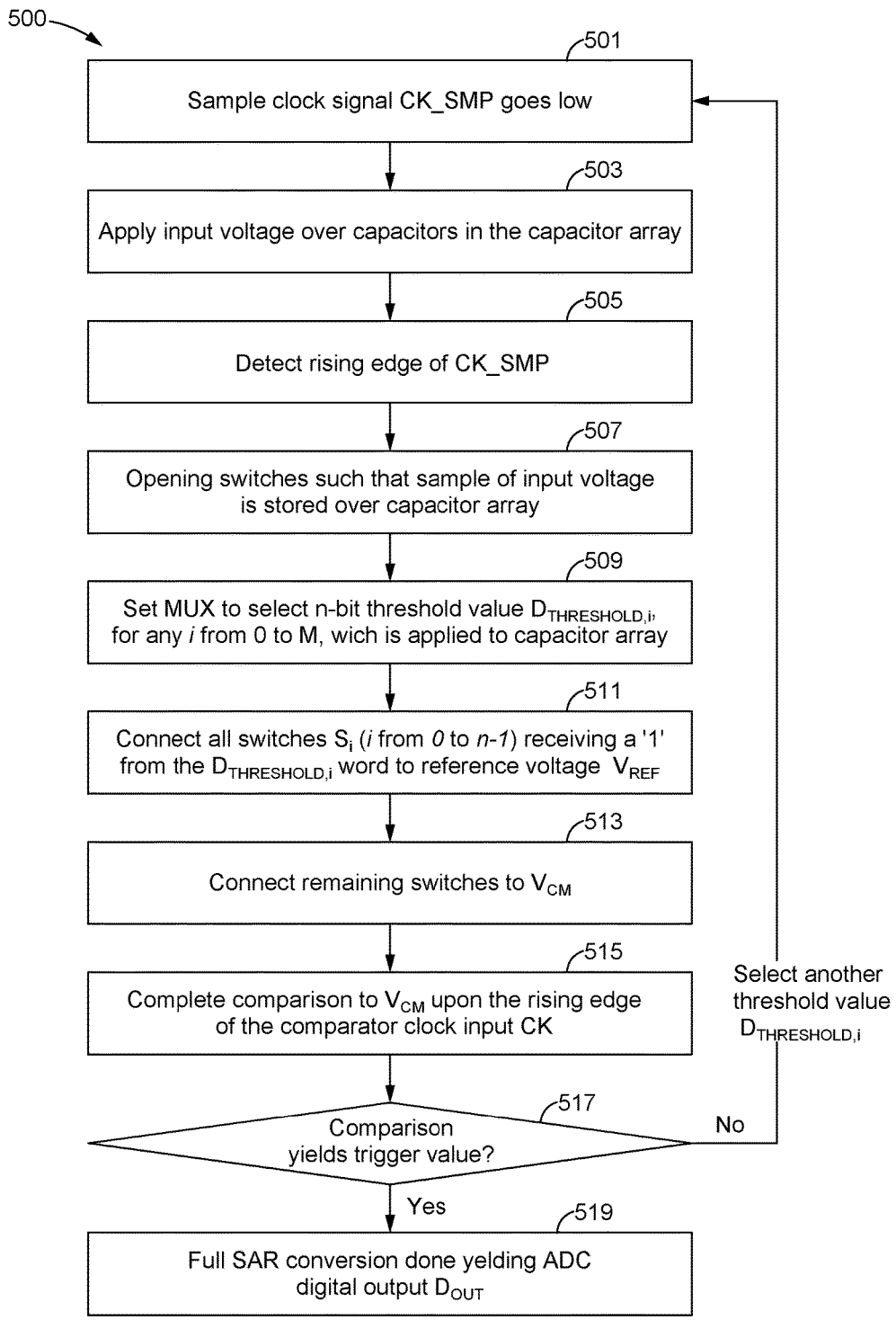
FIG. 5 is a flow chart showing an ADC process in accordance with an embodiment of the disclosed principles.

Although the steps of such a method may be executed in various ways, FIG. 5 is a flow chart showing exemplary steps in an illustrative embodiment. The process 500 begins at stage 501 of the illustrated process 500, when a sample clock signal CK_SMP goes low. A track phase then begins at stage 503 by applying an input voltage $V_{IN}$ over all capacitors in the capacitor array of the ADC. At stage 505, a subsequent rising edge of CK_SMP is detected and a sampling phase is executed at stage 507 by opening the switches such that a sample of $V_{IN}$ is stored over the capacitor array of the ADC.

A comparison phase is then begun at stage 509 by setting the MUX to select an n-bit threshold value $D_{THRESHOLD,i}$ for any i from 0 to M, which is applied to the ADC capacitor array. All switches $S_i$, where i is in the range from 0 to n−1, which receive '1' from the $D_{THRESHOLD,i}$ word, are connected to reference voltage $V_{REF}$ at stage 511 and the remaining switches are connected to a common mode voltage $V_{CM}$ at stage 513. In this way, the output VP of the ADC reaches a value equal to the input voltage $V_{IN}$ subtracted from the analog of $D_{THRESHOLD,0}$. The comparison to $V_{CM}$ by the comparator is then completed at stage 515 upon the rising edge of the comparator clock input CK, such that if $VP > V_{CM}$, then DP is 1 and the sample of $V_{IN}$ is larger than $D_{THRESHOLD,0}$, and otherwise, if $VP < V_{CM}$, then DP is 0 and the sample of $V_{IN}$ is smaller than $D_{THRESHOLD,0}$. If the comparison result reaches the trigger threshold at stage 517, a full SAR conversion is executed at stage 519, yielding the ADC output word $D_{out}$. Otherwise, another threshold value $D_{THRESHOLD,j}$, is selected, where j is in the range from 1 to M, and the comparison phase is repeated until all M threshold values have been compared. After any comparison between $V_{in}$ and $D_{threshold,i}$, and as a consequence of the comparison, a full SAR conversion can be carried out to obtain a full resolution quantization of the input voltage.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:

1. A method of analog-to-digital conversion in a sensor circuit with an input of $V_{IN}$ and having an ADC with a capacitor array comprising a plurality of capacitors connected through a respective plurality of switches (collectively a DAC), a comparator, an SAR module and a multiplexer (MUX) connecting the DAC to the SAR module, the method comprising:
   executing a track phase when a sample clock signal CK_SMP is low by applying an input voltage $V_{IN}$ over all capacitors in the capacitor array of the DAC;
   executing a sampling phase on a subsequent CK_SMP by opening the respective plurality of switches such that a sample of $V_{IN}$ is stored over the capacitor array of the DAC;

executing a comparison phase, by setting the MUX to select an n-bit threshold value $D_{THRESHOLD,0}$ which is applied to the DAC capacitor array, connecting all switches $S_i$, where i is in the range from 0 to n−1, which receive 1, to a reference voltage $V_{REF}$ and connecting the remaining switches to a common mode voltage $V_{CM}$ such that the output VP of the DAC reaches a value equal to the input voltage $V_{IN}$ subtracted from the analog of $D_{THRESHOLD,0}$, and completing the comparison to $V_{CM}$ by the comparator at the comparator clock CK, such that if $VP>V_{CM}$, then DP is 1 and the sample of $V_{IN}$ is larger than $D_{THRESHOLD,0}$, and otherwise, if $VP<V_{CM}$, then DP is 0 and the sample of $V_{IN}$ is smaller than $D_{THRESHOLD,0}$;

selecting another threshold value $D_{THRESHOLD,j}$, where j is in the range from 1 to M, via the MUX and repeating the comparison phase until all M threshold values have been compared; and using one of the threshold comparisons as a trigger to a full SAR conversion of the same sample to obtain a full resolution quantization.

2. The method in accordance with claim 1, wherein the further action comprises an action executed outside of the sensor circuit.

3. The method in accordance with claim 1, further comprising using $D_{THRESHOLD,j}$ as an offset $D_{OFFSET,1}$ away from the threshold $D_{THRESHOLD,0}$, and updating $D_{THRESHOLD,1}$ with $D_{OFFSET,1}+D_{THRESHOLD,0}$ when $D_{THRESHOLD,0}$ is updated.

4. The method in accordance with claim 3, further comprising using $D_{THRESHOLD,2}$ as an offset $D_{OFFSET,2}$ away from $D_{THRESHOLD,0}$, and updating $D_{THRESHOLD,2}$ with $D_{OFFSET,2}+D_{THRESHOLD,0}$ when $D_{THRESHOLD,0}$ is updated.

5. The method in accordance with claim 4, wherein $D_{OFFSET,2} \neq D_{OFFSET,1}$.

6. A sensor system including a processor configured to execute a method of analog-to-digital conversion in a sensor circuit with an input of $V_{IN}$ and having an ADC with a capacitor array comprising a plurality of capacitors connected through a respective plurality of switches (collectively a DAC), a comparator, an SAR module and a multiplexer (MUX) connecting the DAC to the SAR module, the processor being configured to execute the method by:

executing a track phase when a sample clock signal CK_SMP is low by applying an input voltage $V_{IN}$ over all capacitors in the capacitor array of the DAC;

executing a sampling phase on a subsequent CK_SMP by opening the respective plurality of switches such that a sample of $V_{IN}$ is stored over the capacitor array of the DAC;

executing a comparison phase, by setting the MUX to select an n-bit threshold value $D_{THRESHOLD,0}$ which is applied to the DAC capacitor array, connecting all switches $S_i$, where i is in the range from 0 to n−1, which receive 1, to a reference voltage $V_{REF}$ and connecting the remaining switches to a common mode voltage $V_{CM}$ such that the output VP of the DAC reaches a value equal to the input voltage $V_{IN}$ subtracted from the analog of $D_{THRESHOLD,0}$, and completing the comparison to $V_{CM}$ by the comparator at the comparator clock CK, such that if $VP>V_{CM}$, then DP is 1 and the sample of $V_{IN}$ is larger than $D_{THRESHOLD,0}$, and otherwise, if $VP<V_{CM}$, then DP is 0 and the sample of $V_{IN}$ is smaller than $D_{THRESHOLD,0}$;

selecting another threshold value $D_{THRESHOLD,j}$, where j is in the range from 1 to M, via the MUX and repeating the comparison phase until all M threshold values have been compared; and using one of the threshold comparisons as a trigger to a full SAR conversion of the same sample to obtain a full resolution quantization.

7. The sensor system in accordance with claim 6, wherein the further action comprises an action executed outside of the sensor circuit.

8. The sensor system in accordance with claim 6, wherein the processor is further configured to use $D_{THRESHOLD,1}$ as an offset $D_{OFFSET,1}$ away from the threshold $D_{THRESHOLD,0}$, and to update $D_{THRESHOLD,1}$ with $D_{OFFSET,1}+D_{THRESHOLD,0}$ when $D_{THRESHOLD,0}$ is updated.

9. The sensor system in accordance with claim 8, wherein the processor is further configured to use $D_{THRESHOLD,2}$ as an offset $D_{OFFSET,2}$ away from $D_{THRESHOLD,0}$, and to update $D_{THRESHOLD,2}$ with $D_{OFFSET,2}+D_{THRESHOLD,0}$ when $D_{THRESHOLD,0}$ is updated.

10. The sensor system in accordance with claim 9, wherein $D_{OFFSET,2} \neq D_{OFFSET,1}$.

11. A sensor circuit for executing analog-to-digital conversion of a sensed value $V_{IN}$, the sensor circuit comprising:

a DAC having a capacitor array comprising a plurality of capacitors connected through a respective plurality of switches;

a comparator;

an SAR module;

a multiplexer (MUX) connecting the DAC to the SAR module; and a controller configured to execute a track phase when a sample clock signal CK_SMP is low by applying an input voltage $V_{IN}$ over all capacitors in the capacitor array of the DAC, execute a sampling phase on a subsequent CK_SMP by opening the respective plurality of switches such that a sample of $V_{IN}$ is stored over the capacitor array of the ADC, execute a comparison phase, by setting the MUX to select an n-bit threshold value $D_{THRESHOLD,0}$ which is applied to the DAC capacitor array, connect all switches $S_i$, where i is in the range from 0 to n−1, which receive 1, to a reference voltage $V_{REF}$, and connect the remaining switches to a common mode voltage $V_{CM}$ such that the output VP of the DAC reaches a value equal to the input voltage $V_{IN}$ subtracted from the analog of $D_{THRESHOLD,0}$, complete the comparison to $V_{CM}$ by the comparator at the comparator clock CK, such that if $VP>V_{CM}$, then DP is 1 and the sample of $V_{IN}$ is larger than $D_{THRESHOLD,0}$, and otherwise, if $VP<V_{CM}$, then DP is 0 and the sample of $V_{IN}$ is smaller than $D_{THRESHOLD,0}$, select another threshold value $D_{THRESHOLD,j}$, where j is in the range from 1 to M, via the MUX, repeating the comparison phase until all M threshold values have been compared, and use one of the threshold comparisons as a trigger to a full SAR conversion of the same sample to obtain a full resolution quantization.

12. The sensor circuit in accordance with claim 11, wherein the further action comprises an action executed outside of the sensor circuit.

13. The sensor circuit in accordance with claim 11, wherein the controller is further configured to use $D_{THRESHOLD,1}$ as an offset $D_{OFFSET,1}$ away from the threshold $D_{THRESHOLD,0}$, and to update $D_{THRESHOLD,1}$ with $D_{OFFSET,1}+D_{THRESHOLD,0}$ when $D_{THRESHOLD,0}$ is updated.

14. The sensor circuit in accordance with claim 13, wherein the controller is further configured to use $D_{THRESHOLD,2}$ as an offset $D_{OFFSET,2}$ away from $D_{THRESHOLD,0}$, and to update $D_{THRESHOLD,2}$ with $D_{OFFSET,2}+D_{THRESHOLD,0}$ when $D_{THRESHOLD,0}$ is updated.

* * * * *